(12) United States Patent
Lee et al.

(10) Patent No.: US 9,158,684 B2
(45) Date of Patent: Oct. 13, 2015

(54) FLASH-DRAM HYBRID MEMORY MODULE

(71) Applicant: Netlist, Inc., Irvine, CA (US)

(72) Inventors: Hyun Lee, Ladera Ranch, CA (US);
Chi-She Chen, Walnut, CA (US);
Jeffrey C. Solomon, Irvine, CA (US);
Scott H. Milton, Irvine, CA (US);
Jayesh Bhakta, Cerritos, CA (US)

(73) Assignee: NETLIST, INC., Irvine, CA (US)

( * ) Notice: Subject to any disclaimer, the term of this patent is extended or adjusted under 35 U.S.C. 154(b) by 0 days.

(21) Appl. No.: 14/489,269

(22) Filed: Sep. 17, 2014

(65) Prior Publication Data

US 2015/0242313 A1 Aug. 27, 2015

Related U.S. Application Data

(63) Continuation of application No. 13/559,476, filed on Jul. 26, 2012, now Pat. No. 8,874,831, which is a continuation-in-part of application No. 12/240,916, filed on Sep. 29, 2008, now Pat. No. 8,301,833, which is a continuation of application No. 12/131,873, filed on Jun. 2, 2008, now abandoned.

(60) Provisional application No. 61/512,871, filed on Jul. 28, 2011, provisional application No. 60/941,586, filed on Jun. 1, 2007.

(51) Int. Cl.
G06F 12/02 (2006.01)
G06F 12/06 (2006.01)
G06F 13/42 (2006.01)
G11C 7/10 (2006.01)
G11C 14/00 (2006.01)

(52) U.S. Cl.
CPC ........ *G06F 12/0638* (2013.01); *G06F 12/0246* (2013.01); *G06F 13/4243* (2013.01); *G11C 7/1072* (2013.01); *G11C 14/0018* (2013.01); *G06F 2212/205* (2013.01); *G06F 2212/7208* (2013.01)

(58) Field of Classification Search
CPC ............ G06F 12/0638; G06F 12/0246; G06F 13/4243; G11C 7/1072; G11C 14/0018
USPC ................. 711/103, 111, 112, 114, 154, 156; 365/185.33
See application file for complete search history.

(56) References Cited

U.S. PATENT DOCUMENTS

| | | | | |
|---|---|---|---|---|
| 2,043,099 A | * | 6/1936 | Hanna | 361/62 |
| 3,562,555 A | * | 2/1971 | Ahrons | 365/229 |
| 3,916,390 A | * | 10/1975 | Chang et al. | 365/183 |
| 4,234,920 A | * | 11/1980 | Van Ness et al. | 714/22 |
| 4,420,821 A | * | 12/1983 | Hoffman | 365/185.08 |
| 4,449,205 A | * | 5/1984 | Hoffman | 365/185.08 |
| 4,965,828 A | * | 10/1990 | Ergott et al. | 713/193 |
| 5,430,742 A | * | 7/1995 | Jeddeloh et al. | 714/764 |

(Continued)

Primary Examiner — Stephen Elmore
(74) Attorney, Agent, or Firm — Nixon Peabody LLP; Khaled Shami

(57) ABSTRACT

A memory module that is couplable to a memory controller hub (MCH) of a host system includes a non-volatile memory subsystem, a data manager coupled to the non-volatile memory subsystem, a volatile memory subsystem coupled to the data manager and operable to exchange data with the non-volatile memory subsystem by way of the data manager, and a controller operable to receive read/write commands from the MCH and to direct transfer of data between any two or more of the MCH, the volatile memory subsystem, and the non-volatile memory subsystem based on the commands.

24 Claims, 10 Drawing Sheets

(56) References Cited

U.S. PATENT DOCUMENTS

| | | | | |
|---|---|---|---|---|
| 5,519,663 A * | 5/1996 | Harper et al. | | 365/229 |
| 5,519,831 A * | 5/1996 | Holzhammer | | 714/22 |
| 5,563,839 A * | 10/1996 | Herdt et al. | | 365/227 |
| 5,577,213 A * | 11/1996 | Avery et al. | | 710/100 |
| 5,619,644 A * | 4/1997 | Crockett et al. | | 714/45 |
| 5,675,725 A * | 10/1997 | Malcolm | | 714/6.12 |
| 5,870,350 A * | 2/1999 | Bertin et al. | | 365/233.11 |
| 5,874,995 A * | 2/1999 | Naimpally et al. | | 375/240.25 |
| 5,890,192 A * | 3/1999 | Lee et al. | | 711/103 |
| 5,953,215 A * | 9/1999 | Karabatsos | | 361/767 |
| 6,023,421 A * | 2/2000 | Clinton et al. | | 365/63 |
| 6,112,310 A * | 8/2000 | Jun et al. | | 713/501 |
| 6,145,068 A * | 11/2000 | Lewis | | 711/170 |
| 6,158,015 A * | 12/2000 | Klein | | 714/2 |
| 6,199,142 B1 * | 3/2001 | Saulsbury et al. | | 711/118 |
| 6,216,247 B1 * | 4/2001 | Creta et al. | | 714/763 |
| 6,269,382 B1 * | 7/2001 | Cabrera et al. | | 1/1 |
| 6,336,174 B1 * | 1/2002 | Li et al. | | 711/162 |
| 6,336,176 B1 * | 1/2002 | Leyda et al. | | 711/170 |
| 6,421,279 B1 * | 7/2002 | Tobita et al. | | 365/189.011 |
| 6,459,647 B1 * | 10/2002 | Kengeri | | 365/230.03 |
| 6,487,102 B1 * | 11/2002 | Halbert et al. | | 365/51 |
| 6,487,623 B1 * | 11/2002 | Emerson et al. | | 710/302 |
| 6,658,507 B1 * | 12/2003 | Chan | | 710/100 |
| 6,691,209 B1 * | 2/2004 | O'Connell | | 711/114 |
| 6,769,081 B1 * | 7/2004 | Parulkar | | 714/733 |
| 6,799,241 B2 * | 9/2004 | Kahn et al. | | 711/105 |
| 6,799,244 B2 * | 9/2004 | Tanaka et al. | | 711/113 |
| 6,944,042 B2 * | 9/2005 | Komatsuzaki | | 365/145 |
| 6,948,029 B2 * | 9/2005 | Yano | | 711/106 |
| 6,952,368 B2 * | 10/2005 | Miura et al. | | 365/185.11 |
| 7,053,470 B1 * | 5/2006 | Sellers et al. | | 257/678 |
| 7,062,618 B2 * | 6/2006 | Tsunoda et al. | | 711/154 |
| 7,089,412 B2 * | 8/2006 | Chen | | 713/2 |
| 7,102,391 B1 * | 9/2006 | Sun et al. | | 327/10 |
| 7,111,142 B2 * | 9/2006 | Spencer et al. | | 711/170 |
| 7,155,627 B2 * | 12/2006 | Matsui | | 713/401 |
| 7,200,021 B2 * | 4/2007 | Raghuram | | 365/51 |
| 7,234,099 B2 * | 6/2007 | Gower et al. | | 714/767 |
| 7,409,491 B2 * | 8/2008 | Doblar et al. | | 711/103 |
| 7,409,590 B2 * | 8/2008 | Moshayedi et al. | | 714/20 |
| 7,411,859 B2 * | 8/2008 | Sohn et al. | | 365/230.05 |
| 7,421,552 B2 * | 9/2008 | Long | | 711/162 |
| 7,467,251 B2 * | 12/2008 | Park et al. | | 710/307 |
| 7,600,142 B2 * | 10/2009 | Ichikawa | | 713/322 |
| 7,716,411 B2 * | 5/2010 | Panabaker et al. | | 711/101 |
| 7,818,488 B2 * | 10/2010 | Park et al. | | 711/5 |
| 8,086,955 B2 * | 12/2011 | Zhou et al. | | 715/234 |
| 8,102,614 B2 * | 1/2012 | Song et al. | | 360/31 |
| 8,233,303 B2 * | 7/2012 | Best et al. | | 365/51 |
| 8,301,833 B1 * | 10/2012 | Chen et al. | | 711/104 |
| 8,412,879 B2 * | 4/2013 | Chang et al. | | 711/103 |
| 8,874,831 B2 * | 10/2014 | Lee et al. | | 711/103 |
| 2002/0083368 A1 * | 6/2002 | Abe et al. | | 714/24 |
| 2003/0158995 A1 * | 8/2003 | Lee et al. | | 711/105 |
| 2004/0163027 A1 * | 8/2004 | MacLaren et al. | | 714/764 |
| 2004/0190210 A1 * | 9/2004 | Leete | | 361/90 |
| 2005/0044302 A1 * | 2/2005 | Pauley et al. | | 711/1 |
| 2005/0060488 A1 * | 3/2005 | Poechmueller | | 711/106 |
| 2005/0132250 A1 * | 6/2005 | Hansen et al. | | 714/5 |
| 2005/0141273 A1 * | 6/2005 | Park et al. | | 365/185.12 |
| 2006/0039197 A1 * | 2/2006 | Khouri et al. | | 365/185.12 |
| 2006/0069896 A1 * | 3/2006 | Sanders | | 711/168 |
| 2006/0080515 A1 * | 4/2006 | Spiers et al. | | 711/162 |
| 2006/0294295 A1 * | 12/2006 | Fukuzo | | 711/105 |
| 2007/0136523 A1 * | 6/2007 | Bonella et al. | | 711/113 |
| 2007/0192627 A1 * | 8/2007 | Oshikiri | | 713/191 |
| 2008/0104344 A1 * | 5/2008 | Shimozono et al. | | 711/162 |
| 2008/0195806 A1 * | 8/2008 | Cope | | 711/111 |
| 2009/0031099 A1 * | 1/2009 | Sartore | | 711/162 |
| 2010/0274953 A1 * | 10/2010 | Lee et al. | | 711/103 |
| 2011/0320804 A1 * | 12/2011 | Chan et al. | | 713/150 |
| 2012/0204079 A1 * | 8/2012 | Takefman et al. | | 714/758 |
| 2014/0059170 A1 * | 2/2014 | Gasparakis et al. | | 709/217 |

\* cited by examiner

| DRAM density (GB) | # of blocks per bank | Flash wr-time to rd-time ratio | Avg block use time (sec) | Flash write time (sec) | Max allowed Closed Blk in queue to be written back to Flash |
|---|---|---|---|---|---|
| 1 | 250 | 55 | 1.00E-03 | 2.00E-02 | 0 |
| 1 | 250 | 55 | 1.00E-02 | 2.00E-02 | 2 |
| 1 | 250 | 55 | 2.00E-02 | 2.00E-02 | 5 |
| 1 | 250 | 55 | 5.00E-02 | 2.00E-02 | 11 |
| 2 | 500 | 55 | 1.00E-03 | 2.00E-02 | 0 |
| 2 | 500 | 55 | 1.00E-02 | 2.00E-02 | 5 |
| 2 | 500 | 55 | 2.00E-02 | 2.00E-02 | 9 |
| 2 | 500 | 55 | 5.00E-02 | 2.00E-02 | 23 |
| 4 | 1000 | 55 | 1.00E-03 | 2.00E-02 | 1 |
| 4 | 1000 | 55 | 1.00E-02 | 2.00E-02 | 9 |
| 4 | 1000 | 55 | 2.00E-02 | 2.00E-02 | 18 |
| 4 | 1000 | 55 | 5.00E-02 | 2.00E-02 | 45 |

*FIG. 11*

FLASH-DRAM HYBRID MEMORY MODULE

PRIORITY CLAIM

This application is a continuation of U.S. patent application Ser. No. 13/559,476, filed Jul. 26, 2012, now U.S. Pat. No. 8,874,831, titled, "FLASH-DRAM HYBRID MEMORY MODULE" which claims the benefit of provisional patent application Ser. No. 61/512,871, filed Jul. 28, 2011, and is a continuation-in-part of U.S. patent application Ser. No. 12/240,916, filed Sep. 29, 2008, now U.S. Pat. No. 8,301,833, which is a continuation of U.S. patent application Ser. No. 12/131,873, filed Jun. 2, 2008, now abandoned, which claims the benefit of U.S. provisional patent application Ser. No. 60/941,586, filed Jun. 1, 2007, the contents of all of which are incorporated herein by reference in their entirety.

This application may also be considered to be related to co-pending U.S. patent application Ser. No. 13/536,173, filed on Jun. 28, 2012, and commonly owned herewith.

TECHNICAL FIELD

The present disclosure relates generally to computer memory devices, and more particularly, to devices that employ different types of memory devices such as combinations of Flash and random access memories.

BACKGROUND

As technology advances and the usage of portable computing devices, such as tablet notebook computers, increases, more data needs to be transferred among data centers and to/from end users. In many cases, data centers are built by clustering multiple servers that are networked to increase performance.

Although there are many types of networked servers that are specific to the types applications envisioned, the basic concept is generally to increase server performance by dynamically allocating computing and storage resources. In recent years, server technology has evolved to be specific to particular applications such as 'finance transactions' (for example, point-of-service, inter-bank transaction, stock market transaction), 'scientific computation' (for example, fluid dynamic for automobile and ship design, weather prediction, oil and gas expeditions), 'medical diagnostics' (for example, diagnostics based on the fuzzy logic, medical data processing), 'simple information sharing and searching' (for example, web search, retail store website, company home page), 'email' (information distribution and archive), 'security service', 'entertainment' (for example, video-on-demand), and so on. However, all of these applications suffer from the same information transfer bottleneck due to the inability of a high speed CPU (central processing unit) to efficiently transfer data in and out of relatively slower speed storage or memory subsystems, particularly since data transfers typically pass through the CPU input/output (I/O) channels.

The data transfer limitations by the CPU are exemplified by the arrangement shown in FIG. 1, and apply to data transfers between main storage (for example the hard disk (HD) or solid state drive (SSD) and the memory subsystems (for example DRAM DIMM (Dynamic Random Access Memory Dual In-line Memory Module) connected to the front side bus (FSB)). In arrangements such as that of FIG. 1, the SSD/HD and DRAM DIMM of a conventional memory arrangement are connected to the CPU via separate memory control ports (not shown). FIG. 1 specifically shows, through the double-headed arrow, the data flow path between the computer or server main storage (SSD/HD) to the DRAM DIMMs. Since the SSD/HD data I/O and the DRAM DIMM data I/O are controlled by the CPU, the CPU needs to allocate its process cycles to control these I/Os, which may include the IRQ (Interrupt Request) service which the CPU performs periodically. As will be appreciated, the more time a CPU allocates to controlling the data transfer traffic, the less time the CPU has to perform other tasks. Therefore, the overall performance of a server will deteriorate with the increased amount of time the CPU has to expend in performing data transfer.

There have been various approaches to increase the data transfer throughput rates from/to the main storage, such as SSD/HD, to local storage, such as DRAM DIMM. In one example as illustrated in FIG. 2, EcoRAM™ developed by Spansion provides a storage SSD based system that assumes a physical form factor of a DIMM. The EcoRAM™ is populated with Flash memories and a relatively small memory capacity using DRAMs which serve as a data buffer. This arrangement is capable of delivering higher throughput rate than a standard SSD based system since the EcoRAM™ is connected to the CPU (central processing unit) via a high speed interface, such as the HT (Hyper Transport) interface, while an SSD/HD is typically connected via SATA (serial AT attachment), USB (universal serial bus), or PCI Express (peripheral component interface express). For example, the read random access throughput rate of EcoRAM™ is near 3 GB/s compared with 400 MB/s for a NAND SSD memory subsystem using the standard PCI Express-based. This is a 7.5× performance improvement. However, the performance improvement for write random access throughput rate is less than 2× (197 MBs for the EcoRAM vs. 104 MBs for NAND SSD). This is mainly due to the fact that the write speed is cannot be faster than the NAND Flash write access time. FIG. 2 is an example of EcoRAM™ using SSD with the form factor of a standard DIMM such that it can be connected to the FSB (front side bus). However, due to the interface protocol difference between DRAM and Flash, an interface device, EcoRAM Accelerator™), which occupies one of the server's CPU sockets is used, and hence further reducing server's performance by reducing the number of available CPU sockets available, and in turn reducing the overall computation efficiency. The server's performance will further suffer due to the limited utilization of the CPU bus due to the large difference in the data transfer throughput rate between read and write operations.

The EcoRAM™ architecture enables the CPU to view the Flash DIMM controller chip as another processor with a large size of memory available for CPU access.

In general, the access speed of a Flash based system is limited by four items: the read/write speed of the Flash memory, the CPU's FSB bus speed and efficiency, the Flash DIMM controller's inherent latency, and the HT interconnect speed and efficiency which is dependent on the HT interface controller in the CPU and Flash DIMM controller chip.

The published results indicate that these shortcomings are evident in that the maximum throughput rate is 1.56 GBs for the read operation and 104 MBs for the write operation. These access rates are 25% of the DRAM read access speed, and 1.7% of the DRAM access speed at 400 MHz operation. The disparity in the access speed (15 to 1) between the read operation and write operation highlight a major disadvantage of this architecture. The discrepancy of the access speed between this type of architecture and JEDEC standard DRAM DIMM is expected to grow wider as the DRAM memory technology advances much faster than the Flash memory.

Overview

Described herein is a memory module couplable to a memory controller of a host system. The memory module includes a non-volatile memory subsystem, a data manager coupled to the non-volatile memory subsystem, a volatile memory subsystem coupled to the data manager and operable to exchange data with the non-volatile memory subsystem by way of the data manager, and a controller operable to receive commands from the memory controller and to direct (i) operation of the non-volatile memory subsystem, (ii) operation of the volatile memory subsystem, and (iii) transfer of data between any two or more of the memory controller, the volatile memory subsystem, and the non-volatile memory subsystem based on at least one received command from the memory controller.

Also described herein is a method for managing a memory module by a memory controller, the memory module including volatile and non-volatile memory subsystems. The method includes receiving control information from the memory controller, wherein the control information is received using a protocol of the volatile memory subsystem. The method further includes identifying a data path to be used for transferring data to or from the memory module using the received control information, and using a data manager and a controller of the memory module to transfer data between any two or more of the memory controller, the volatile memory subsystem, and the non-volatile memory subsystem based on at least one of the received control information and the identified data path.

Also described herein is a memory module wherein the data manager is operable to control one or more of data flow rate, data transfer size, data buffer size, data error monitoring, and data error correction in response to receiving at least one of a control signal and control information from the controller.

Also described herein is a memory module wherein the data manager controls data traffic between any two or more of the memory controller, the volatile memory subsystem, and the non-volatile memory subsystem based on instructions received from the controller.

Also described herein is a memory module wherein data traffic control relates to any one or more of data flow rate, data transfer size, data buffer size, data transfer bit width, formatting information, direction of data flow, and the starting time of data transfer.

Also described herein is a memory module wherein the controller configures at least one of a first memory address space of the volatile memory subsystem and a second memory address space of the non-volatile memory subsystem in response to at least one of a received command from the memory controller and memory address space initialization information of the memory module.

Also described herein is a memory module wherein the data manager is configured as a bi-directional data transfer fabric having two or more sets of data ports coupled to any one of the volatile and non-volatile memory subsystems.

Also described herein is a memory module wherein at least one of the volatile and non-volatile memory subsystems comprises one or more memory segments.

Also described herein is a memory module wherein each memory segment comprises at least one memory circuit, memory device, or memory die.

Also described herein is a memory module wherein the volatile memory subsystem comprises DRAM memory.

Also described herein is a memory module wherein the non-volatile memory subsystem comprises flash memory.

Also described herein is a memory module wherein at least one set of data ports is operated by the data manager to independently and/or concurrently transfer data to or from one or more memory segments of the volatile or non-volatile memory subsystems.

Also described herein is a memory module wherein the data manager and controller are configured to effect data transfer between the memory controller and the non-volatile memory subsystem in response to memory access commands received by the controller from the memory controller.

Also described herein is a memory module wherein the volatile memory subsystem is operable as a buffer for the data transfer between the memory controller and non-volatile memory.

Also described herein is a memory module wherein the data manager further includes a data format module configured to format data to be transferred between any two or more of the memory controller, the volatile memory subsystem, and the non-volatile memory subsystem based on control information received from the controller.

Also described herein is a memory module wherein the data manager further includes a data buffer for buffering data delivered to or from the non-volatile memory subsystem.

Also described herein is a memory module wherein the controller is operable to perform one or more of memory address translation, memory address mapping, address domain conversion, memory access control, data error correction, and data width modulation between the volatile and non-volatile memory subsystems.

Also described herein is a memory module wherein the controller is configured to effect operation with the host system in accordance with a prescribed protocol.

Also described herein is a memory module wherein the prescribed protocol is selected from one or more of DDR, DDR2, DDR3, and DDR4 protocols.

Also described herein is a memory module wherein the controller is operable to configure memory space in the memory module based on at least one of a command received from the memory controller, a programmable value written into a register, a value corresponding to a first portion of the volatile memory subsystem, a value corresponding to a first portion of the non-volatile memory subsystem, and a timing value.

Also described herein is a memory module wherein the controller configures the memory space of the memory module using at least a first portion of the volatile memory subsystem and a first portion of the non-volatile memory subsystem, and the controller presents a unified memory space to the memory controller.

Also described herein is a memory module wherein the controller configures the memory space in the memory module using partitioning instructions that are application-specific.

Also described herein is a memory module wherein the controller is operable to copy booting information from the non-volatile to the volatile memory subsystem during power up.

Also described herein is a memory module wherein the controller includes a volatile memory control module, a non-volatile memory control module, data manager control module, a command interpreter module, and a scheduler module.

Also described herein is a memory module wherein commands from the volatile memory control module to the volatile memory subsystem are subordinated to commands from the memory controller to the controller.

Also described herein is a memory module wherein the controller effects pre-fetching of data from the non-volatile to the volatile memory.

Also described herein is a memory module wherein the pre-fetching is initiated by the memory controller writing an address of requested data into a register of the controller.

Also described herein is a memory module wherein the controller is operable to initiate a copy operation of data of a closed block in the volatile memory subsystem to a target block in the non-volatile memory subsystem.

Also described herein is a memory module wherein, if the closed block is re-opened, the controller is operable to abort the copy operation and to erase the target block from the non-volatile memory subsystem.

Also described herein is a method for managing a memory module wherein the transfer of data includes a bidirectional transfer of data between the non-volatile and the volatile memory subsystems.

Also described herein is a method for managing a memory module further comprising operating the data manager to control one or more of data flow rate, data transfer size, data width size, data buffer size, data error monitoring, data error correction, and the starting time of the transfer of data.

Also described herein is a method for managing a memory module further comprising operating the data manager to control data traffic between the memory controller and at least one of the volatile and non-volatile memory subsystems.

Also described herein is a method for managing a memory module wherein data traffic control relates to any one or more of data transfer size, formatting information, direction of data flow, and the starting time of the transfer of data.

Also described herein is a method for managing a memory module wherein data traffic control by the data manager is based on instructions received from the controller.

Also described herein is a method for managing a memory module further comprising operating the data manager as a bi-directional data transfer fabric with two or more sets of data ports coupled to any one of the volatile and non-volatile memory subsystems.

Also described herein is a method for managing a memory module wherein at least one of the volatile and non-volatile memory subsystems comprises one or more memory segments.

Also described herein is a method for managing a memory module wherein each memory segment comprises at least one memory circuit, memory device, or memory die.

Also described herein is a method for managing a memory module wherein the volatile memory subsystem comprises DRAM memory.

Also described herein is a method for managing a memory module wherein the non-volatile memory subsystem comprises Flash memory.

Also described herein is a method for managing a memory module further comprising operating the data ports to independently and/or concurrently transfer data to or from one or more memory segments of the volatile or non-volatile memory subsystems.

Also described herein is a method for managing a memory module further comprising directing transfer of data bi-directionally between the volatile and non-volatile memory subsystems using the data manager and in response to memory access commands received by the controller from the memory controller.

Also described herein is a method for managing a memory module further comprising buffering the data transferred between the memory controller and non-volatile memory subsystem using the volatile memory subsystem.

Also described herein is a method for managing a memory module further comprising using the controller to perform one or more of memory address translation, memory address mapping, address domain conversion, memory access control, data error correction, and data width modulation between the volatile and non-volatile memory subsystems.

Also described herein is a method for managing a memory module further comprising using the controller to effect communication with a host system by the volatile memory subsystem in accordance with a prescribed protocol.

Also described herein is a method for managing a memory module wherein the prescribed protocol is selected from one or more of DDR, DDR2, DDR3, and DDR4 protocols.

Also described herein is a method for managing a memory module further comprising using the controller to configure memory space in the memory module based on at least one of a command received from the memory controller, a programmable value written into a register, a value corresponding to a first portion of the volatile memory subsystem, a value corresponding to a first portion of the non-volatile memory subsystem, and a timing value.

Also described herein is a method for managing a memory module wherein the controller configures the memory space of the memory module using at least a first portion of the volatile memory subsystem and a first portion of the non-volatile memory subsystem, and the controller presents a unified memory space to the memory controller.

Also described herein is a method for managing a memory module wherein the controller configures the memory space in the memory module using partitioning instructions that are application-specific.

Also described herein is a method for managing a memory module further comprising using the controller to copy booting information from the non-volatile to the volatile memory subsystem during power up.

Also described herein is a method for managing a memory module wherein the controller includes a volatile memory control module, the method further comprising generating commands by the volatile memory control module in response to commands from the memory controller, and transmitting the generated commands to the volatile memory subsystem.

Also described herein is a method for managing a memory module further comprising pre-fetching of data from the non-volatile memory subsystem to the volatile memory subsystem.

Also described herein is a method for managing a memory module wherein the pre-fetching is initiated by the memory controller writing an address of requested data into a register of the controller.

Also described herein is a method for managing a memory module further comprising initiating a copy operation of data of a closed block in the volatile memory subsystem to a target block in the non-volatile memory subsystem.

Also described herein is a method for managing a memory module further comprising aborting the copy operation when the closed block of the volatile memory subsystem is re-opened, and erasing the target block in the non-volatile memory subsystem.

BRIEF DESCRIPTION OF THE DRAWINGS

The accompanying drawings, which are incorporated into and constitute a part of this specification, illustrate one or more examples of embodiments and, together with the description of example embodiments, serve to explain the principles and implementations of the embodiments.

In the drawings:

FIG. 11 is a table showing estimates of the maximum allowed closed blocks in a queue to be written back to Flash memory for different DRAM densities using various average block use time.

DESCRIPTION OF EXAMPLE EMBODIMENTS

Figure 1:
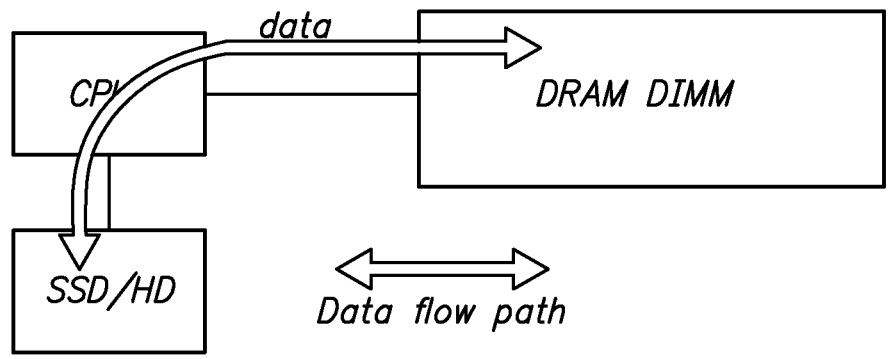
FIG. 1 is a block diagram illustrating the path of data transfer, via a CPU, of a conventional memory arrangement.

Example embodiments are described herein in the context of a system of computers, servers, controllers, memory modules, hard disk drives and software. Those of ordinary skill in the art will realize that the following description is illustrative only and is not intended to be in any way limiting. Other embodiments will readily suggest themselves to such skilled persons having the benefit of this disclosure. Reference will now be made in detail to implementations of the example embodiments as illustrated in the accompanying drawings. The same reference indicators will be used to the extent possible throughout the drawings and the following description to refer to the same or like items.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with this disclosure, the components, process steps, and/or data structures described herein may be implemented using various types of operating systems, computing platforms, computer programs, and/or general purpose machines. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein. Where a method comprising a series of process steps is implemented by a computer or a machine and those process steps can be stored as a series of instructions readable by the machine, they may be stored on a tangible medium such as a computer memory device (e.g., ROM (Read Only Memory), PROM (Programmable Read Only Memory), EEPROM (Electrically Eraseable Programmable Read Only Memory), Flash memory, Jump Drive, and the like), magnetic storage medium (e.g., tape, magnetic disk drive, and the like), optical storage medium (e.g., CD-ROM, DVD-ROM, paper card, paper tape and the like) and other types of program memory.

The term "exemplary" where used herein is intended to mean "serving as an example, instance or illustration." Any embodiment described herein as "exemplary" is not necessarily to be construed as preferred or advantageous over other embodiments.

Disclosed herein are arrangements for improving memory access rates and addressing the high disparity (15 to 1 ratio) between the read and write data throughput rates. In one arrangement, a Flash-DRAM-hybrid DIMM (FDHDIMM) with integrated Flash and DRAM is used. Methods for controlling such an arrangement are described.

In certain embodiments, the actual memory density (size or capacity) of the DIMM and/or the ratio of DRAM memory to Flash memory are configurable for optimal use with a particular application (for example, POS, inter-bank transaction, stock market transaction, scientific computation such as fluid dynamics for automobile and ship design, weather prediction, oil and gas expeditions, medical diagnostics such as diagnostics based on the fuzzy logic, medical data processing, simple information sharing and searching such as web search, retail store website, company home page, email or information distribution and archive, security service, and entertainment such as video-on-demand).

In certain embodiments, the device contains a high density Flash memory with a low density DRAM, wherein the DRAM is used as a data buffer for read/write operation. The Flash serves as the main memory. Certain embodiments described herein overcome the needs of having a long separation period between an Activate command (may be referred to as RAS) and a corresponding read or write command (may be referred to as first CAS command).

Figure 3A:
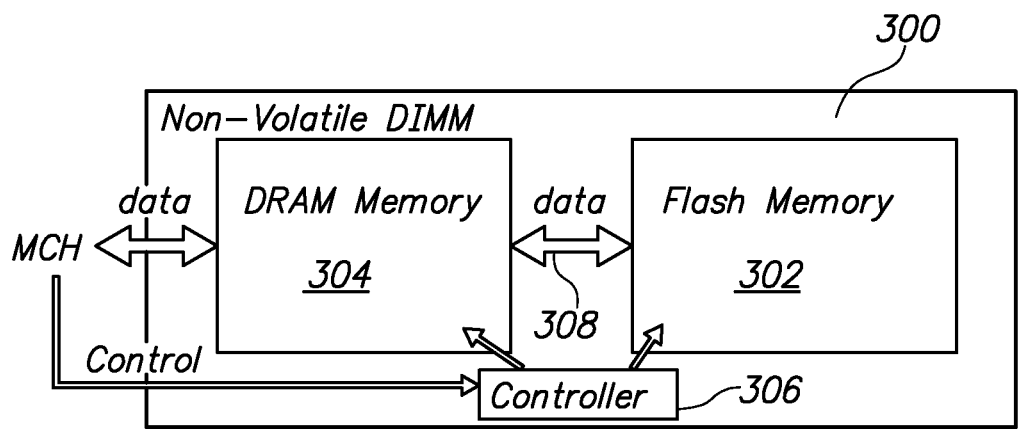
FIGS. 3A and 3B are block diagrams of a non-volatile memory DIMM or NVDIMM.
Figure 2:
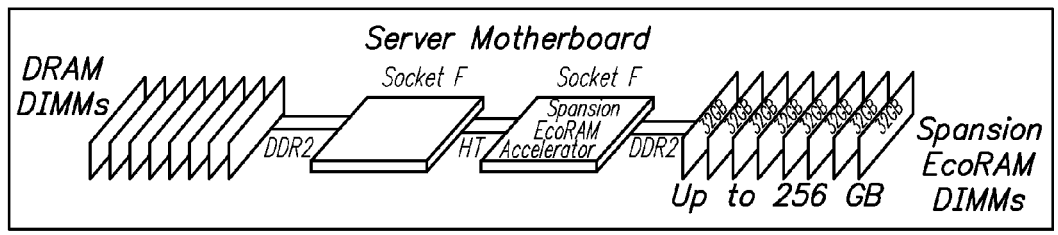
FIG. 2 is a block diagram of a known EcoRAM™ architecture.
Figure 2:
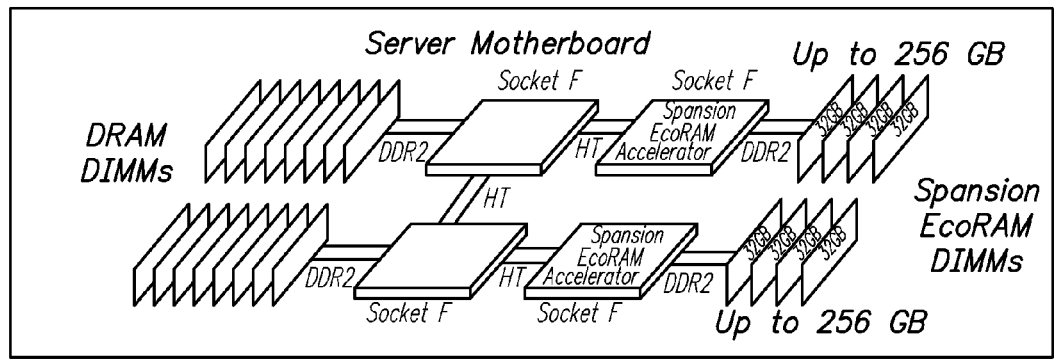
Figure 3B:
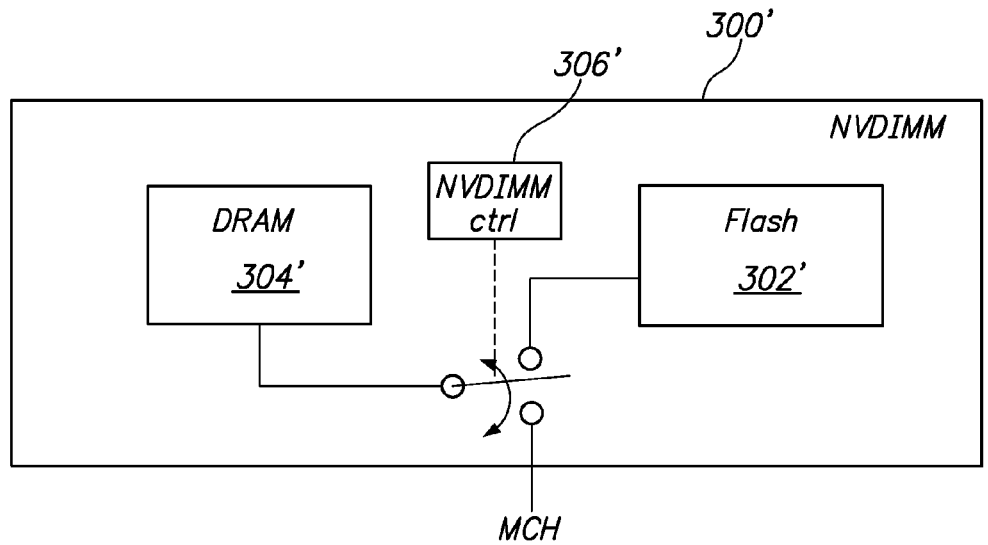

In accordance with one embodiment, described with reference to FIGS. 3A and 3B, a memory system 300 includes a non-volatile (for example Flash) memory subsystem 302 and a volatile (for example DRAM) memory subsystem 304. The examples of FIGS. 3A and 3B are directed to architectures of a non-volatile DIMM (NVDIMM) NVDIMM system that may use a power subsystem (not shown) that can include a battery or a capacitor as a means for energy storage to copy DRAM memory data into Flash memory when power loss occurs, is detected, or is anticipated to occur during operation. When normal power is restored, a restore NVDIMM operation is initiated and the data stored in the Flash memory is properly restored to the DRAM memory. In this architecture, the density of the Flash is about the same as the DRAM memory size or within a few multiples, although in some applications it may be higher. This type of architecture may also be used to provide non-volatile storage that is connected to the FSB (front side bus) to support RAID (Redundant Array of Independent Disks) based systems or other type of operations. An NVDIMM controller 306 receives and interprets commands from the system memory controller hub (MCH). The NVDIMM controller 306 control the NVDIMM DRAM and Flash memory operations. In FIG. 3A, the DRAM 304 communicates data with the MCH, while an internal bus 308 is used for data transfer between the DRAM and Flash memory subsystems. In FIG. 3B, the NVDIMM controller 306' of NVDIMM 300' monitors events or commands and enables data transfer to occur in a first mode between the DRAM 304' and Flash 302' or in a second mode between the DRAM and the MCH.

Figure 4B:
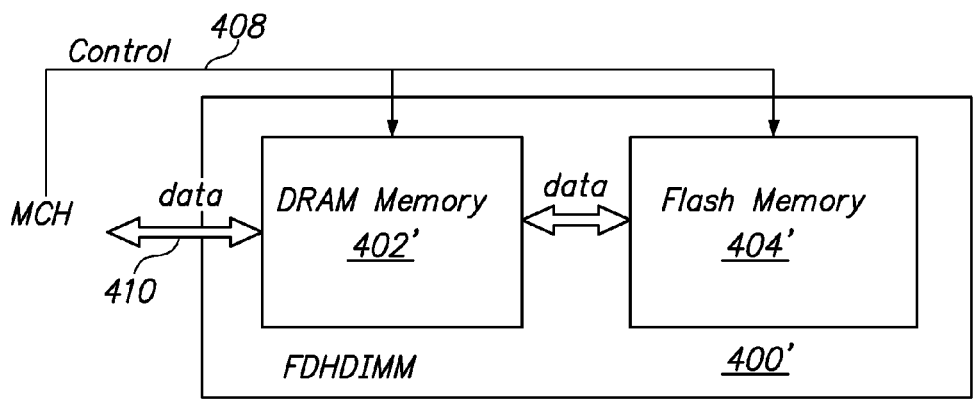
FIGS. 4A and 4B are block diagrams of a Flash-DRAM hybrid DIMM or FDHDIMM.
Figure 4A:
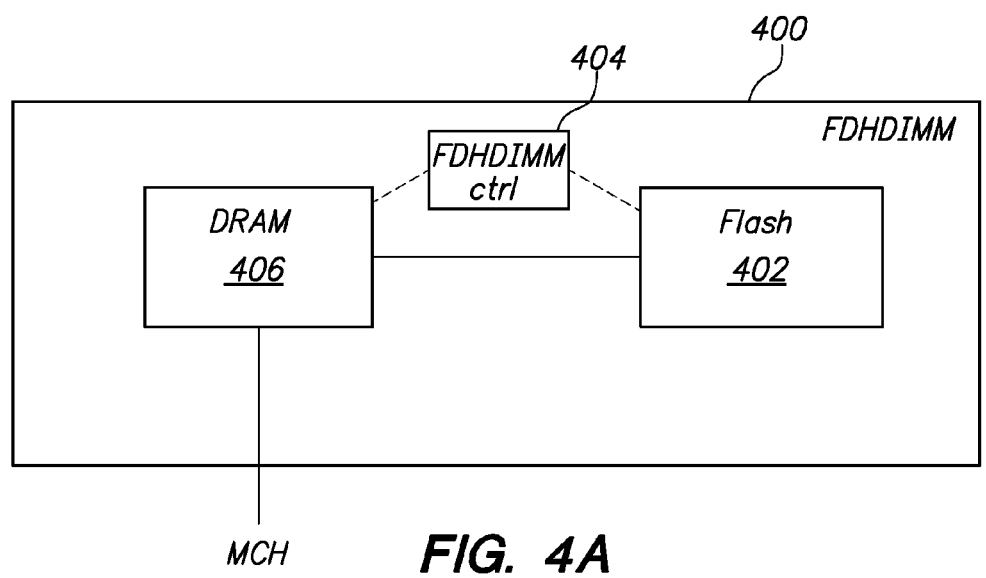

In accordance with one embodiment, a general architecture for a Flash and DRAM hybrid DIMM (FDHDIMM) system 400 is shown in FIG. 4A. The FDHDIMM interfaces with an MCH (memory controller hub) to operate and behave as a high density DIMM, wherein the MCH interfaces with the non-volatile memory subsystem (for example Flash) 402 is controlled by an FDHDIMM controller 404. Although the MCH interfaces with the Flash via the FDHDIMM controller, the FDHDIMM overall performance is governed by the Flash access time. The volatile memory subsystem (for example DRAM) 406 is primarily used as a data buffer or a temporary storage location such that data from the Flash memory 402 is transferred to the DRAM 406 at the Flash access speed, and buffered or collected into the DRAM 406, which then transfers the buffered data to the MCH based on the access time of DRAM. Similarly, when the MCH transfers data to the DRAM 406, the FDHDIMM controller 404 manages the data transfer from the DRAM 406 to the Flash 402. Since the Flash memory access speed (both read and write) is relatively slower than DRAM, (e.g. for example a few hundred microseconds for read access), the average data throughput rate of FDHDIMM 400 is limited by the Flash access speed. The DRAM 406 serves as a data buffer stage that buffers the MCH read or write data. Thus, the DRAM 406 serves as a temporary storage for the data to be transferred from/to the Flash 402. Furthermore, in accordance with one embodiment, the MCH recognizes the physical density of an FDHDIMM operating as a high density DIMM as the density of Flash alone.

In accordance with one embodiment, a read operation can be performed by the MCH by sending an activate command (may be simply referred to as RAS, or row address strobe) to the FDHDIMM 400 to conduct a pre-fetch read data operation from the Flash 402 to the DRAM 406, with the pre-fetch data size being for example a page (1 KB or 2 KB, or may be programmable to any size). The MCH then sends a read command (may be simply referred to as CAS, or column address strobe) to read the data out input of the DRAM. In this embodiment, the data transfer from Flash to DRAM occurs at Flash access speed rates, while data transfer from DRAM to MCH occurs at DRAM access speed rates. In this example, data latency and throughput rates are the same as any DRAM operation as long as the read operations are executed onto the pages that were opened with the activate command previously sent to pre-fetch data from the Flash to DRAM. Thus, a longer separation time period between the RAS (e.g. Activate command) and the first CAS (column address strobe e.g. read or write command) is required to account for the time it takes to pre-fetch data from the Flash to DRAM.

An example of FDHDIMM operating as a DDR DIMM with SSD is shown in FIG. 4B, wherein the FDHDIMM 400' supports two different interface interpretations to the MCH. In the first interface interpretation, the MCH views the FDHDIMM 400' as a combination of DRAM DIMM and SSD (not illustrated). In this mode the MCH needs to manage two address spaces, one for the DRAMs 402' and one for the Flash 404'. The MCH is coupled to, and controls, both of the DRAM and Flash memory subsystems. One advantage of this mode is that the CPU does not need to be in the data path when data is moved from DRAM to Flash or from Flash to DRAM. In the second interface interpretation, the MCH views the FDHDIMM 400' as an on-DIMM Flash with the SSD in an extended memory space that is behind the DRAM space. Thus, in this mode, the MCH physically fetches data from the SSD to the DDR DRAM and then the DRAM sends the data to the MCH. Since all data movement occurs on the FDHDIMM, this mode will provide better performance than if the data were to be moved through or via the CPU.

In accordance with one embodiment and as shown in FIG. 4B, the FDHDIMM 400' receives control signals 408 from the MCH, where the control signals may include one or more control signals specifically for the DRAM 402' operation and one or more control signals specifically for the Flash 404' operation. In this embodiment, the MCH or CPU is coupled to the FDHDIMM via a single data bus interface 410 which couples the MCH to the DRAM.

Figure 5A:
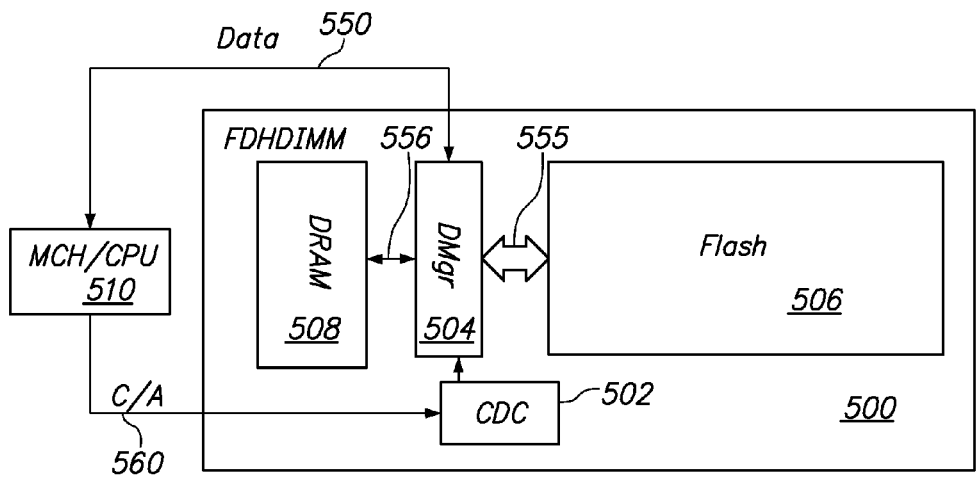
FIG. 5A is a block diagram of a memory module 500 in accordance with certain embodiments described herein.
Figure 5B:
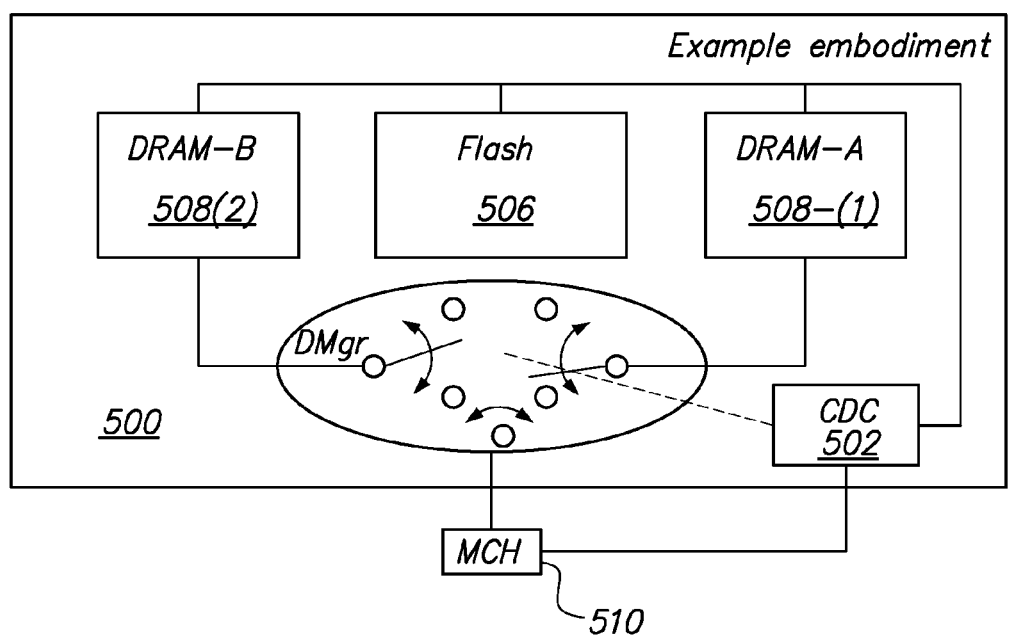
FIG. 5B is a block diagram showing some functionality of a memory module such as that shown in FIG. 5A.

FIGS. 5A and 5B are block diagrams of a memory module 500 that is couplable to a host system (not shown). The host system may be a server or any other system comprising a memory system controller or an MCH for providing and controlling the read/write access to one or more memory systems, wherein each memory system may include a plurality of memory subsystems, a plurality of memory devices, or at least one memory module. The term "read/write access" means the ability of the MCH to interface with a memory system or subsystem in order to write data into it or read data from it, depending on the particular requirement at a particular time.

In certain embodiments, memory module 500 is a Flash-DRAM hybrid memory subsystem which may be integrated with other components of a host system. In certain embodiments, memory module 500 is a Flash-DRAM hybrid memory module that has the DIMM (dual-inline memory module) form factor, and may be referred to as a FDHDIMM, although it is to be understood that in both structure and operation it may be different from the FDHDIMM discussed above and described with reference to FIGS. 4A and 4B. Memory module 500 includes two on-module intermediary components: a controller and a data manager. These on-module intermediary components may be physically separate components, circuits, or modules, or they may be integrated onto a single integrated circuit or device, or integrated with other memory devices, for example in a three dimensional stack, or in any one of several other possible expedients for integration known to those skilled in the art to achieve a specific design, application, or economic goal. In the case of a DIMM, these on-module intermediary components are an on-DIMM Controller (CDC) 502 and an on-DIMM data manager (DMgr) 504. While the DIMM form factor will predominate the discussion herein, it should be understood that this is for illustrative purposes only and memory systems using other form factors are contemplated as well. CDC 502 and data manager DMgr 504 are operative to manage the interface between a non-volatile memory subsystem such as a Flash 506, a volatile memory subsystem such as a DRAM 508, and a host system represented by MCH 510.

In certain embodiments, CDC 502 controls the read/write access to/from Flash memory 506 from/to DRAM memory 508, and to/from DRAM memory from/to MCH 510. Read/write access between DRAM 508, Flash 506 and MCH 510 may be referred to herein generally as communication, wherein control and address information C/A 560 is sent from MCH 510 to CDC 502, and possible data transfers follow as indicated by Data 550, Data 555, and/or Data 556. In certain embodiments, the CDC 502 performs specific functions for memory address transformation, such as address translation, mapping, or address domain conversion, Flash access control, data error correction, manipulation of data width or data formatting or data modulation between the Flash memory and DRAM, and so on. In certain embodiments, the CDC 502 ensures that memory module 500 provides transparent operation to the MCH in accordance with certain industry standards, such as DDR, DDR2, DDR3, DDR4 protocols. In the arrangement shown in FIGS. 5A and 5B, there is no direct access from the MCH 510 to the Flash 506 memory subsystem. Thus in accordance with certain embodiments, the Flash access speed has minimal impact on the overall FDH-DIMM access speed. In the schematic illustration of FIG. 5B and in accordance with one embodiment, the CDC controller 502 receives standard DDR commands from the MCH, interprets, and produces commands and/or control signals to control the operation of the Data manager (DMgr), the Flash memory and the DRAM memory. The DMgr controls the data path routing amongst DRAMs, Flash and MCH, as detailed below. The data path routing control signals are independently operated without any exclusivity.

Figure 6:
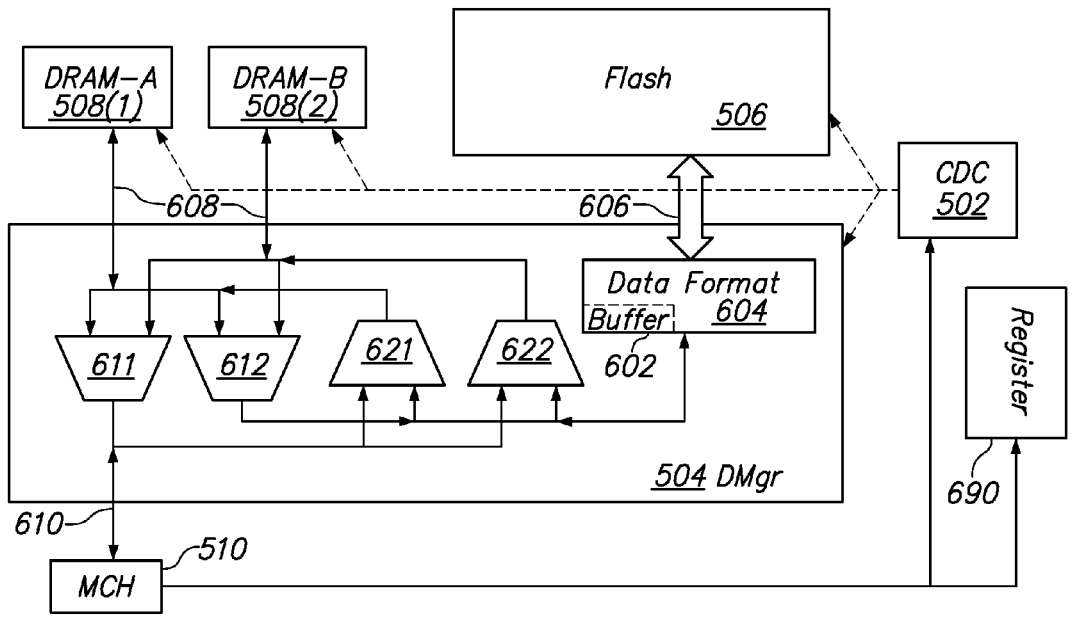
FIG. 6 is a block diagram showing some details of the data manager (DMgr)

An exemplary role of DMgr 504 is described with reference to FIG. 6. In certain embodiments and in response to communication from CDC 502, DMgr 504 provides a variety of functions to control data flow rate, data transfer size, data buffer size, data error monitoring or data error correction. For example, these functions or operations can be performed on-the-fly (while data is being transferred via the DMgr 504) or performed on buffered or stored data in DRAM or a buffer. In addition, one role of DMgr 504 is to provide interoperability among various memory subsystems or components and/or MCH 510.

In one embodiment, an exemplary host system operation begins with initialization. The CDC 502 receives a first command from the MCH 510 to initialize FDHDIMM 500 using a certain memory space. The memory space as would be controlled by MCH 510 can be configured or programmed during initialization or after initialization has completed. The MCH 510 can partition or parse the memory space in various ways that are optimized for a particular application that the host system needs to run or execute. In one embodiment, the CDC 502 maps the actual physical Flash 506 and DRAM 508 memory space using the information sent by MCH 510 via the first command. In one embodiment, the CDC 502 maps the memory address space of any one of the Flash 506 and DRAM 508 memory subsystems using memory address space information that is received from the host system, stored in a register within FDHDIMM 500, or stored in a memory location of a non-volatile memory subsystem, for example a portion of Flash 506 or a separate non-volatile memory subsystem. In one embodiment, the memory address space information corresponds to a portion of initialization information of the FDHDIMM 500.

In one embodiment, MCH 510 may send a command to restore a certain amount of data information from Flash 506 to DRAM 508. The CDC 502 provides control information to DMgr 504 to appropriately copy the necessary information from Flash 506 to the DRAM 508. This operation can provide support for various host system booting operations and/or a special host system power up operation.

In one embodiment, MCH 510 sends a command which may include various fields comprising control information regarding data transfer size, data format options, and/or startup time. CDC 502 receives and interprets the command and provides control signals to DMgr 504 to control the data traffic between the Flash 506, the DRAM 508, and the MCH 510. For example, DMgr 504 receives the data transfer size, formatting information, direction of data flow (via one or more multiplexers such as 611, 612, 621, 622 as detailed below), and the starting time of the actual data transfer from CDC 502. DMgr 504 may also receive additional control information from the CDC 502 to establish a data flow path and/or to correctly establish the data transfer fabric. In certain embodiments, DMgr 504 also functions as a bi-directional data transfer fabric. For example, DMgr 504 may have more than 2 sets of data ports facing the Flash 506 and the DRAM 508. Multiplexers 611 and 612 provide controllable data paths from any one of the DRAMs 508(1) and 508(2) (DRAM-A and DRAM-B) to any one of the MCH 510 and the Flash 506. Similarly multiplexers 621 and 622 provide controllable data paths from any one of the MCH and the Flash memory to any one of the DRAMs 508(1) and 508(2) (DRAM-A and DRAM-B). In one embodiment, DRAM 508(1) is a segment of DRAM 508, while in other embodiments, DRAM 508(1) is a separate DRAM memory subsystem. It will be understood that each memory segment can comprise one or more memory circuits, a memory devices, and/or memory integrated circuits. Of course other configurations for DRAM 508 are possible, and other data transfer fabrics using complex data paths and suitable types of multiplexing logic are contemplated.

In accordance with one embodiment, the two sets of multiplexors 611, 612 and 621, 622 allow independent data transfer to Flash 506 from DRAM-A 508(1) and DRAM-B 508(2). For example, in response to one or more control signals or a command from CDC 502, DMgr 504 can transfer data from DRAM-A 508(1) to MCH 510, via multiplexer 611, at the same time as from DRAM-B 508(2) to the Flash 506, via multiplexer 612; or data is transferred from DRAM-B 508(2) to MCH 510, via multiplexer 611, and simultaneously data is transferred from the Flash 506 to DRAM-A 508(1), via multiplexer 621. Further, in the same way that data can be transferred to or from the DRAM in both device-wide or segment-by-segment fashion, data can be transferred to or from the flash memory in device-wide or segment-by-segment fashion, and the flash memory can be addressed and accessed accordingly.

In accordance with one embodiment the illustrated arrangement of data transfer fabric of DMgr 504 also allows the CDC 502 to control data transfer from the Flash memory to the MCH by buffering the data from the Flash 506 using a buffer 602, and matching the data rate and/or data format of MCH 510. The buffer 602 is shown in FIG. 6 as a portion of a data format module 604; however, buffer 602 may also be a distributed buffer such that one buffer is used for each one of the set of multiplexer logic elements shown as multiplexers 611, 612, 621, and 622. Various buffer arrangements may be used, such as a programmable size buffer to meet the requirement of a given system design requirement, for example the disparity between read/write access time; or overall system performance, for example latency. In certain embodiments, the buffer 604 may introduce one or more clock cycle delays into a data communication path between MCH 510, DRAM 508, and Flash 506.

In certain embodiments, data format module 604 contains a data formatting subsystem (not shown) to enable DMgr 504 to format and perform data transfer in accordance with control information received from CDC 502. Data buffer 604 of data format module 602, discussed above, also supports a wide data bus 606 coupled to the Flash memory 506 operating at a first frequency, while receiving data from DRAM 508 using a relatively smaller width data bus 608 operating at a second frequency, the second frequency being larger than the first frequency in certain embodiments. The buffer 602 is designed to match the data flow rate between the DRAM 508 and the Flash 506.

A register 690 provides the ability to register commands received from MCH 510 via C/A 560 (FIG. 5A). The register 690 may communicate these commands to CDC 502 and/or to the DRAM 508 and/or Flash 506. The register 690 communicates these registered commands to CDC 502 for processing. The register 690 may also include multiple registers (not shown), such that it can provide the ability to register multiple commands, a sequence of commands, or provide a pipeline delay stage for buffering and providing a controlled execution of certain commands received form MCH 510.

In certain embodiments, the register 690 may register commands from MCH 510 and transmit the registered commands to DRAM 508 and/or Flash 506 memory subsystems. In certain embodiments, the CDC 502 monitors commands received from MCH 510, via control and address bus C/A 560, and provides appropriate control information to DMgr 504, DRAM 508, or Flash 506 to execute these commands and perform data transfer operations between MCH 510 and FDHDIMM 500 via MCH data bus 610.

Figure 7:
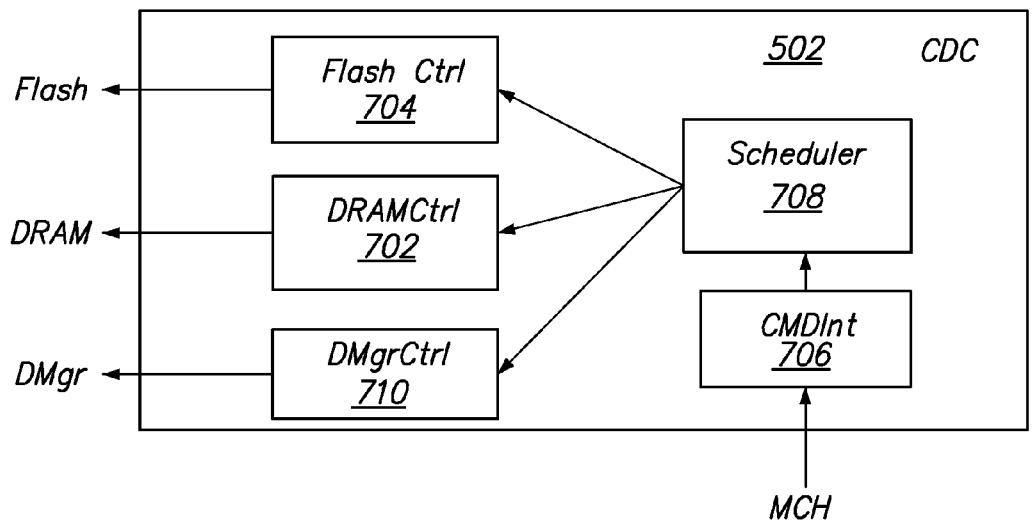
FIG. 7 is a functional block diagram of the on-module controller (CDC)

FIG. 7 illustrates a functional block diagram of the CDC 502. In certain embodiments, the major functional blocks of the CDC 502 are a DRAM control block DRAMCtrl 702, Flash control block FlashCtrl 704, MCH command interpreter CmdInt 706, DRAM-Flash interface scheduler Scheduler 708, and DMgr control block (DMgrCtrl) 710.

In accordance with one embodiment, DRAMCtrl 702 generates DRAM commands that are independent from the commands issued by the MCH 510. In accordance with one embodiment, when the MCH 510 initiates a read/write operation from/to the same DRAM 508 that is currently executing a command from the DRAMCtrl 702, then the CDC 502 may choose to instruct DRAMCtrl 702 to abort its operation in order to execute the operation initiated by the MCH. However, the CDC 502 may also pipeline the operation so that it causes DRAMCtrl 702 to either halt or complete its current operation prior to executing that of the MCH. The CDC 502 may also instruct DRAMCtrl 702 to resume its operation once the command from MCH 510 is completed.

In accordance with one embodiment, the FlashCtrl 704 generates appropriate Flash commands for the proper read/write operations. The CmdInt 706 intercepts commands received from MCH 510 and generates the appropriate control information and control signals and transmit them to the appropriate FDHDIMM functional block. For example, CmdInt 706 issues an interrupt signal to the DRAMCtrl 702 when the MCH issues a command that collides (conflicts) with the currently executing or pending commands that DRAMCtrl 702 has initiated independently from MCH 510, thus subordinating these commands to those from the MCH. The Scheduler 708 schedules the Flash-DRAM interface operation such that there is no resource conflict in the DMgr 504. In accordance with one embodiment, the Scheduler 708 assigns time slots for the DRAMCtrl 702 and FlashCtrl 704 operation based on the current status and the pending command received or to be received from the MCH. The DMgrCtrl 710 generates and sends appropriate control information and control signals for the proper operation and control of the data transfer fabric to enable or disable data paths between Flash 506, DRAM 508, and the MCH 510.

Figure 8A:
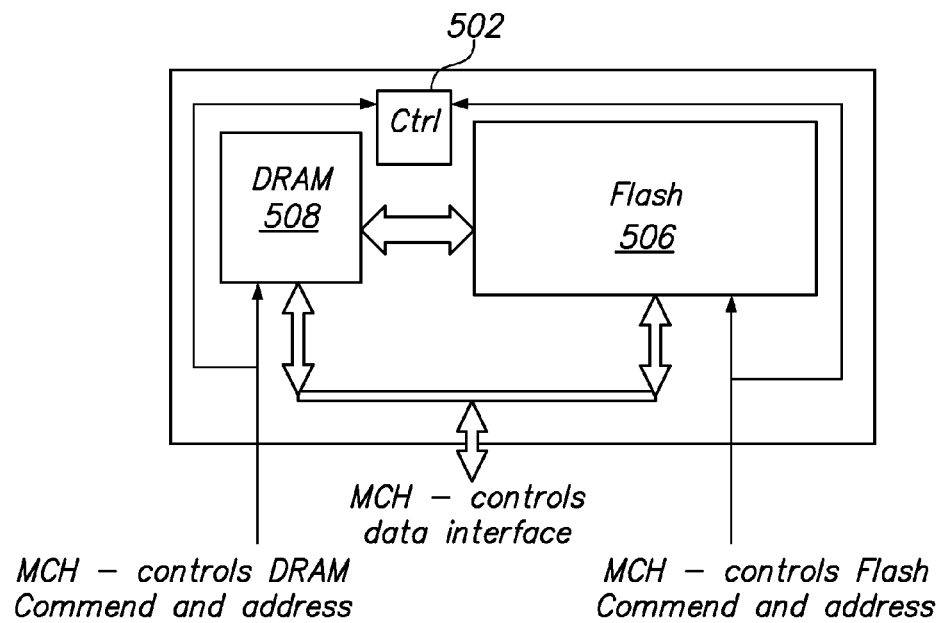
FIG. 8A is a block diagram showing more details of the prior art Flash-DRAM hybrid DIMM (FDHDIMM) of FIGS. 4A and 4B.

FIG. 8A is a block diagram showing a Flash-DRAM hybrid DIMM (FDHDIMM) 801. As seen from FIG. 8A, this Flash-DRAM hybrid DIMM requires two separate and independent address buses to separately control the address spaces: one for the Flash memory Flash 803 and the other for the DRAM memory DRAM 805. The MCH 810 treats the DRAM 805 and Flash 803 as separate memory subsystems, for example DRAM and SSD/HD memory subsystems. The memory in each address space is controlled directly by the MCH. However, the on-DIMM data path 807 between Flash 803 and DRAM 805 allows for direct data transfer to occur between the Flash 803 and the DRAM 805 in response to control information from Ctrl 830. In this embodiment, this data transfer mechanism provides direct support for executing commands from the MCH without having the MCH directly controlling the data transfer, and thus improving data transfer performance from Flash 803 to the DRAM 805. However, the MCH needs to manage two address spaces and two different memory protocols simultaneously. Moreover, the MCH needs to map the DRAM memory space into the Flash memory space, and the data interface time suffers due to the difference in the data access time between the Flash memory and the DRAM memory.

Figure 8B:
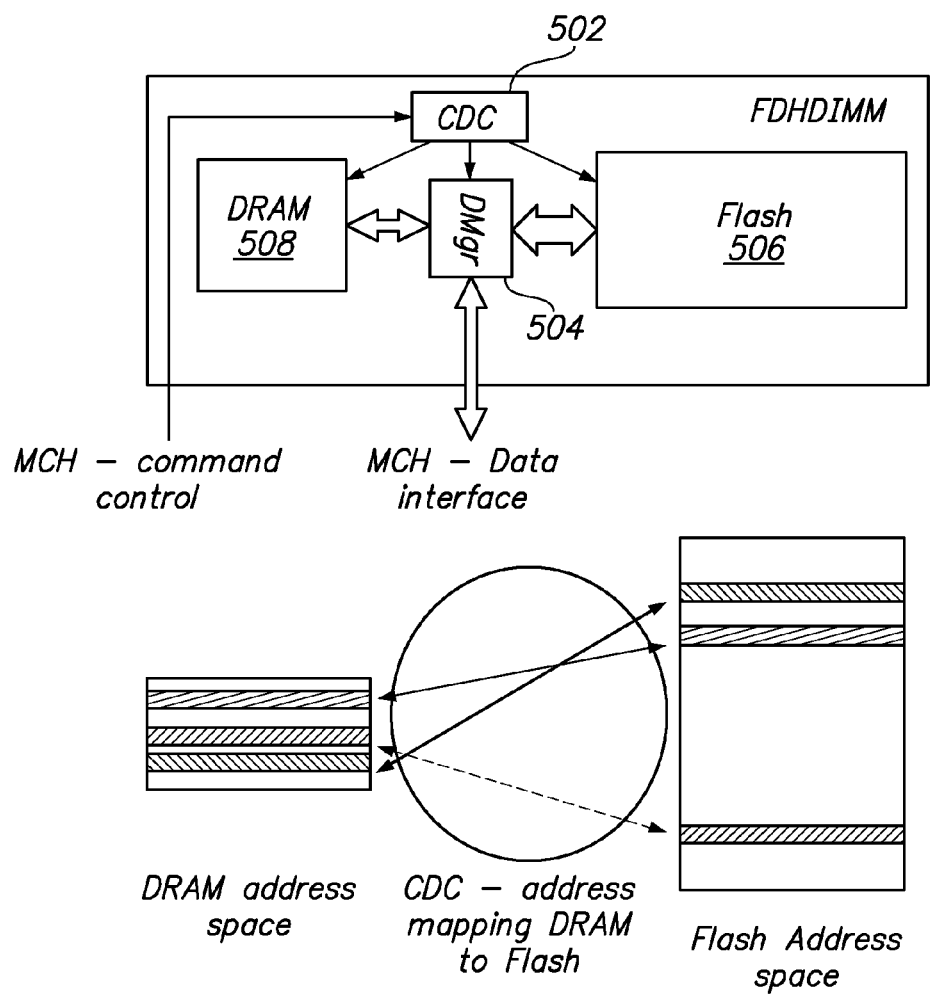
FIG. 8B is a block diagram of a Flash-DRAM hybrid DIMM (FDHDIMM) in accordance with certain embodiments disclosed herein.

In accordance with one embodiment, a memory space mapping of a Flash-DRAM hybrid DIMM is shown in FIG. 8B. A memory controller of a host system (not shown) controls both of the DRAM 508 address space and the Flash 506 address space using a single unified address space. The CDC 502 receives memory access commands from the MCH and generates control information for appropriate mapping and data transfer between Flash and DRAM memory subsystem to properly carry out the memory access commands. In one embodiment, the memory controller of the host system views the large Flash memory space as a DRAM memory space, and accesses this unified memory space with a standard DDR (double data rate) protocol used for accessing DRAM. The unified memory space in this case can exhibit overlapping memory address space between the Flash 506 and the DRAM 508. The overlapping memory address space may be used as a temporary storage or buffer for data transfer between the Flash 506 and the DRAM 508. For example, the DRAM memory space may hold a copy of data from the selected Flash memory space such that the MCH can access this data normally via DDR memory access commands. The CDC 502 controls the operation of the Flash 506 and DRAM 508 memory subsystems in response to commands received from a memory controller of a host system.

In one embodiment, the unified memory space corresponds to a contiguous address space comprising a first portion of the address space of the Flash 506 and a first portion of the address space of the DRAM 508. The first portion of the address space of the Flash 506 can be determined via a first programmable register holding a first value corresponding to the desired Flash memory size to be used. Similarly, the first portion of the address space of the DRAM 508 can be determined via a second programmable register holding a second value corresponding to the desired DRAM memory size to be used. In one embodiment, any one of the first portion of the address space of the Flash 506 and the first portion of the address space of the DRAM 508 is determined via a first value corresponding to a desired performance or memory size, the first value being received by the CDC 502 via a command sent by memory controller of the host system.

Figure 9:
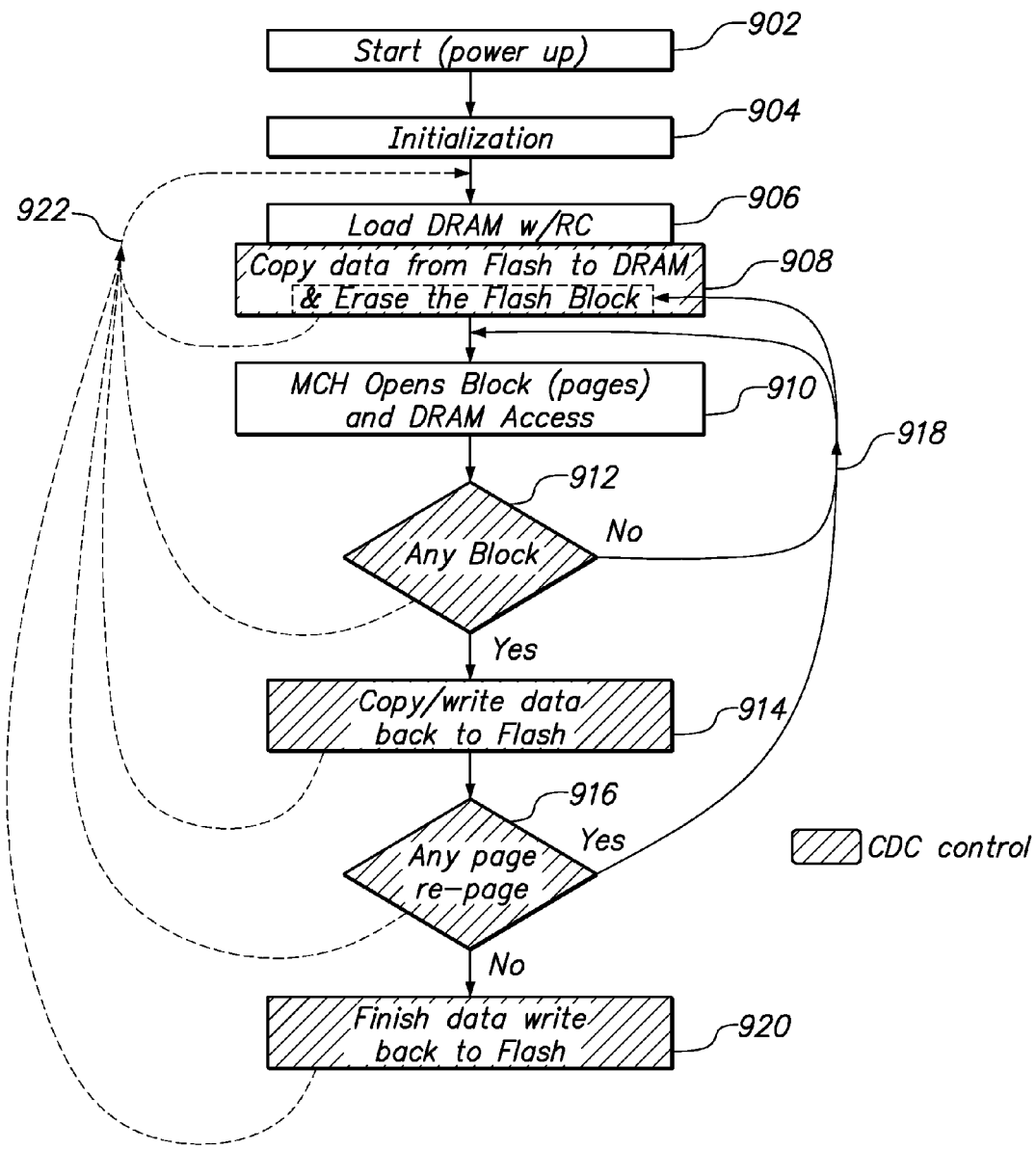
FIG. 9 is a flow diagram directed to the transfer of data from Flash memory to DRAM memory and vice versa in an exemplary FDHDIMM.

In accordance with one embodiment, a flow diagram directed to the transfer of data from Flash memory to DRAM memory and vice versa in an exemplary FDHDIMM is shown in FIG. 9. In certain embodiments, data transfer from the Flash 506 to the DRAM 508 occurs in accordance with memory access commands which the CDC 502 receives from the memory controller of the host system. In certain embodiments, the CDC 502 controls the data transfer from the DRAM 508 to the Flash 506 so as to avoid conflict with any memory operation that is currently being executed. For example, when all the pages in a particular DRAM memory block are closed. The CDC 502 partitions the DRAM memory space into a number of blocks for the purpose of optimally supporting the desired application. The controller can configure memory space in the memory module based on at least one of one or more commands received from the MCH, instructions received from the MCH, a programmable value written into a register, a value corresponding to a first portion of the volatile memory subsystem, a value corresponding to a first portion of the non-volatile memory subsystem, and a timing value. Furthermore, the block size can be configurable by the memory controller of the host system, such that the number pages in a block can be optimized to support a particular application or a task. Furthermore, the block size may be configured on-the-fly, e.g. CDC 502 can receive instruction regarding a desired block size from the memory controller via a memory command, or via a programmable value.

In certain embodiments, a memory controller can access the memory module using a standard access protocol, such as JEDEC's DDR DRAM, by sending a memory access command to the CDC 502 which in turn determines what type of a data transfer operation it is and the corresponding target address where the data information is stored, e.g. data information is stored in the DRAM 508 or Flash 506 memory subsystems. In response to a read operation, if the CDC 502 determines that data information, e.g. a page (or block), does not reside in the DRAM 508 but resides in Flash 506, then the CDC 502 initiates and controls all necessary data transfer operations from Flash 506 to DRAM 508 and subsequently to the memory controller. In one embodiment, once the CDC 502 completes the data transfer operation of the requested data information from the Flash 506 to the DRAM 508, the CDC 502 alerts the memory controller to retrieve the data information from the DRAM 508. In on embodiment, the memory controller initiates the copying of data information from Flash 506 to DRAM 508 by writing, into a register in the CDC 502, the target Flash address along with a valid block size. The CDC 502 in turn, executes appropriate operations and generates control information to copy the data information to the DRAM 508. Consequently, the memory controller can access or retrieve the data information using standard memory access commands or protocol.

An exemplary flow chart is shown in FIG. 9, a starting step or power up 902, is followed by an initialization step 904, the memory controller initiates, at step 906, a data move from the Flash 506 to the DRAM 508 by writing target address and size, to a control register in the CDC 502, which then copies, at 908, data information from the Flash 506 to the DRAM 508 and erases the block in the Flash. Erasing the data information from Flash may be accomplished independently from (or concurrently with) other steps that CDC 502 performs in this flow chart, i.e. other steps can be executed concurrently with the Erase the Flash block step. Once the data information or a block of data information is thus moved to the DRAM 508, the memory controller can operate on this data block using standard memory access protocol or commands at 910. The CDC 502 checks, at 912, if any of the DRAM 508 blocks, or copied blocks, are closed. If the memory controller closed any open blocks in DRAM 508, then the CDC 502 initiate a Flash write to write the closed block from the DRAM 508 to the Flash 506, at 914. In addition, the memory controller, at 916, reopens the closed block that is currently being written into the Flash 506, then the CDC 502 stops the Flash write operation and erases the Flash block which was being written to, as shown at 918. Otherwise, the CDC 502 continues and completes the writing operation to the Flash at 920.

The dashed lines in FIG. 9 indicate independent or parallel activities that can be performed by the CDC 502. At any time the CDC 502 receives a DRAM load command from a memory controller which writes a Flash target address and/or block size information into the RC register(s) at 922, as described above, then the CDC 502 executes a load DRAM w/RC step 906 and initiates another branch (or a thread) of activities that includes steps 908-922. In one embodiment, the CDC 502 controls the data transfer operations between DRAM 508 and Flash 506 such that the Flash 506 is completely hidden from the memory controller. The CDC 502 monitors all memory access commands sent by the memory controller using standard DRAM protocol and appropriately configures and manipulate both Flash 506 and DRAM 508 memory subsystems to perform the requested memory access operation and thus achieve the desired results. The memory controller does not interface directly with the Flash memory subsystem. Instead, the memory controller interfaces with the CDC 502 and/or DMgr 504 as shown in FIG. 5 and FIG. 6. Moreover, the memory controller may use one or more protocol, such as DDR, DDR2, DDR3, DDR4 protocols or the like.

Figure 10:
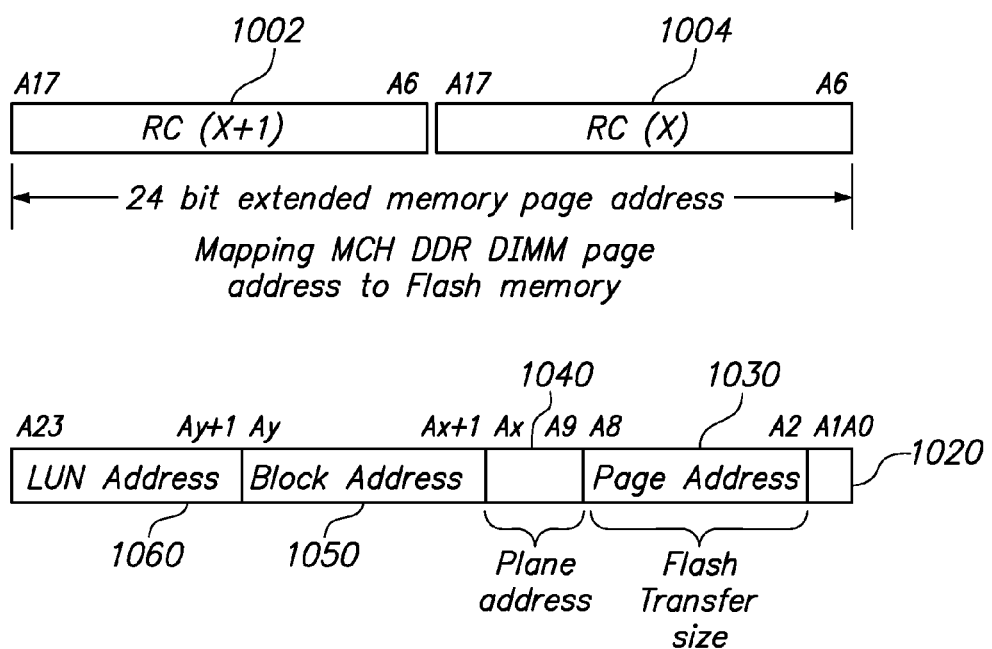
FIG. 10 is a block diagram showing an example of mapping of DRAM address space to Flash memory address space.

In accordance with one embodiment, an example of mapping a DRAM address space to Flash memory address space is shown in FIG. 10. Two sets (1002, 1004) of address bits AD6 to AD17, forming a 24 bit extended memory page address, are allocated for the block address. For example, assuming a Block size of 256K Bytes, then a 24-bit block address space (using the two sets of AD6 to AD17 1002 and 1004) would enable access to 4 TB of Flash memory storage space. If a memory module has 1 GB of DRAM storage capacity, then it can hold approximately 4K Blocks of data in the DRAM memory, each Block comprise 256 K Bytes of data. The DRAM address space, corresponding to the 4K blocks, can be assigned to different virtual ranks and banks, where the number of virtual ranks and banks is configurable and can be manipulated to meet a specific design or performance needs. For example, if a 1G Bytes memory module is configured to comprise two ranks with eight banks per rank, then each bank would hold two hundred fifty (250) blocks or the equivalent of 62 M Bytes or 62K pages, where each page correspond to a 1K Bytes. Other configurations using different page, block, banks, or ranks numbers may also be used. Furthermore, an exemplary mapping of 24-bit DDR DIMM block address to Flash memory address, using Block addressing as described above, is shown in FIG. 10. The 24-bit can be decomposed into fields, such as a logical unit number LUN address 1060 field, a Block address 1050 field, a Plane address 1040, a Page address 1030, and a group of least significant address bits $A_0A_1$ 1020. The Plane address 1040 is a sub address of the block address, and it may be used to support multiple page IO so as to improve Flash memory subsystem operation. In this example, it is understood that different number of bits may be allocated to each field of the 24-bit The CDC 502 manages the block write-back operation by queuing the blocks that are ready to be written back to the Flash memory. As described above, if any page in a queued block for a write operation is reopened, then the CDC 502 will stop the queued block write operation, and remove the block from the queue. Once all the pages in a block are closed, then the CDC 502 restarts the write-back operation and queue the block for a write operation.

In accordance with one embodiment, an exemplary read operation from Flash 506 to DRAM 508 can be performed in approximately 400 μs, while a write operation from DRAM 508 to Flash 506 can be performed in approximately 22 ms resulting in a read to write ratio of 55 to 1. Therefore, if the average time a host system's memory controller spends accessing data information in a Block of DRAM is about 22 ms (that is the duration that a Block comprises one or more pages that are open), then the block write-back operation from DRAM to Flash would not impact performance and hence the disparity between read and write access may be completely hidden from the memory controller. If the block usage time is 11 ms instead of 22 ms, then the CDC 502 control the data transfer operation between DRAM 508 and Flash 506 such that there are no more than 9 closed blocks in the queue to be written-back to the Flash memory, hence approximately an average of 100 ms can be maintained for a standard DDR DRAM operation. Moreover, the number of closed Blocks in the queue to be written-back to the Flash memory subsystem varies with the average block usage time and the desired performance for a specific host system or for a specific application running using the host system resources.

Consequently, the maximum number of closed Blocks to be written-back to Flash can be approximated to be ((# of blocks per bank)/(ratio of 'Flash_block-_write_time' to 'Flash_read_time'))*((Block usage time)/('Flash_block_write_time'))

In order to maintain less than 100 ms time period for queued write-back Blocks, then using a Flash memory subsystem having 22 ms write access time per Block would results in a maximum number of four Blocks to be queued for write operation to Flash 506. Therefore, on average approximately 88 ms (=22 ms*4) for blocks means that each bank should not have more than four Blocks that need to be written back to the Flash 506.

The above equation also indicates that bigger DRAM memory space can support shorter block usage times. For example, 2 GB of DRAM memory allows the 8 closed blocks to be written-back to Flash. The table in FIG. 11 provides an estimation of the maximum allowed closed blocks in the queue to be written back to the Flash memory for different DRAM density using various average block use time.

While embodiments and applications have been shown and described, it would be apparent to those skilled in the art having the benefit of this disclosure that many more modifications than mentioned above are possible without departing from the inventive concepts disclosed herein. The invention, therefore, is not to be restricted except in the spirit of the appended claims.

What is claimed is:

1. A memory module comprising:
a first plurality of data signal lines forming a first data bus;
a second plurality of data signal lines forming a second data bus;
a third plurality of data signal lines forming a data bus;
a data manager coupled to the data bus, the first data bus, and the second data bus, wherein the memory module is couplable to a memory controller of a host system using the data bus, a control bus, and an address bus;
a non-volatile memory subsystem coupled to the data manager using the first data bus, the non-volatile memory subsystem operable to communicate data signals with the data manager by way of the first data bus;
a volatile memory subsystem coupled to the data manager using the second data bus, the volatile memory subsystem operable to communicate data signals with the data manager by way of the second data bus; and
a controller operable to receive one or more memory access commands from the memory controller of the host system by way of the control bus and the address bus, the controller operable to generate at least one of a first, second and third plurality of signals in response to the one or more memory access commands received from the memory controller of the host system, the controller operable to direct (i) operation of the non-volatile memory subsystem using the first plurality of signals, (ii) operation of the volatile memory subsystem using the second plurality of signals, and (iii) operation of the data manager using the third plurality of signals.

2. The memory module of claim 1, wherein, in response to the first plurality of signals, data signals are communicated between the non-volatile memory subsystem and the data manager by way of the first data bus.

3. The memory module of claim 1, wherein, in response to the second plurality of signals, data signals are communicated between the volatile memory subsystem and the data manager by way of the second data bus.

4. The memory module of claim 1, wherein, in response to the third plurality of signals, data signals are communicated between the data manager and at least one of (i) the memory controller of the host system by way of the data bus, (ii) the non-volatile memory subsystem by way of the first data bus, and (iii) the volatile memory subsystem by way of the second data bus.

5. The memory module of claim 1, wherein each of the data bus, the first data bus, and the second data bus includes bi-directional data signal lines.

6. The memory module of claim 1, wherein the data manager further comprises a data formatting subsystem operable, based on control information received from the controller, to format data to be transferred between any two or more of the memory controller of the host system, the volatile memory subsystem, and the non-volatile memory subsystem.

7. The memory module of claim 6, wherein the data manager further comprises a data formatting subsystem operable, in response to the third plurality of signals received from the controller, to format data to be transferred between any two or more of the memory controller of the host system, the volatile memory subsystem, and the non-volatile memory subsystem.

8. The memory module of claim 1, wherein the controller is operable to receive the one or more memory access commands from the memory controller of the host system using a protocol of the volatile memory subsystem.

9. The memory module of claim 5, wherein the protocol of the volatile memory subsystem is a JEDEC standard double data rate (DDR) protocol.

10. The memory module of claim 9, wherein the volatile memory subsystem includes at least one memory circuit, memory device, or memory die, and the controller communicates with the volatile memory subsystem using the protocol of the volatile memory subsystem.

11. The memory module of claim 9, wherein the controller communicates with the non-volatile memory subsystem using a protocol of the non-volatile memory subsystem.

12. The memory module of claim 11, wherein the protocol of the non-volatile memory subsystem is different from the protocol of the volatile memory subsystem.

13. The memory module of claim 1, wherein the memory module is in communication with the memory controller of the host system by way of a JEDEC standard double data rate (DDR) protocol.

14. The memory module of claim 1, wherein the controller is operable to configure a unified memory space of the memory module using at least a first portion of the volatile memory subsystem and a first portion of the non-volatile memory subsystem, the controller operable to present the unified memory space as a volatile memory space to the memory controller of the host system.

15. The memory module of claim 14, wherein the memory controller of the host system accesses the unified memory space using a standard protocol of the volatile memory subsystem.

16. The memory module of claim 15, wherein the standard protocol of the volatile memory subsystem is a JEDEC standard double data rate (DDR) protocol used for accessing standard DDR DRAM.

17. A memory module comprising:
- a data manager couplable to a memory controller of a host system using a data bus, the data manager operable to communicate data signals with the memory controller of the host system by way of the data bus using a first protocol;
- a non-volatile memory subsystem coupled to the data manager using a first data bus, the non-volatile memory subsystem operable to communicate data signals with the data manager by way of the first data bus using a second protocol;
- a volatile memory subsystem coupled to the data manager using a second data bus, the volatile memory subsystem operable to communicate data signals with the data manager by way of the second data bus using the first protocol; and
- a controller operable to receive one or more commands from the memory controller of the host system via a control bus and an address bus using the first protocol, and in response to the one or more commands from the memory controller of the host system, the controller is operable to direct (i) operation of the non-volatile memory subsystem using a first plurality of signals, (ii) operation of the volatile memory subsystem using a second plurality of signals, and (iii) operation of the data manager using a third plurality of signals,
- wherein in response to any one or more of the first, second, and third plurality of signals the data manager communicates data signals with at least one of the memory controller of the host system, the volatile memory subsystem, and the non-volatile memory subsystem.

18. The memory module of claim 17, wherein the first, second and third plurality of signals are generated by the controller in response to the one or more commands from the memory controller of the host system.

19. The memory module of claim 17, wherein the first protocol is a JEDEC standard double data rate (DDR) protocol, and wherein the second protocol is different from the first protocol.

20. The memory module of claim 17, wherein, based on instructions received from the controller using the third plurality of signals, the data manager is operable to control data traffic between any two or more of the memory controller, the volatile memory subsystem, and the non-volatile memory subsystem.

21. The memory module of claim 17, wherein, in response to the third plurality of signals received from the controller, the data manager is operable to control data traffic between any two or more of the memory controller, the volatile memory subsystem, and the non-volatile memory subsystem.

22. The memory module of claim 20, wherein the data traffic control relates to any one or more of data flow rate, data transfer size, data buffer size, data transfer bit width, formatting information, direction of data flow, and a starting time of a data transfer.

23. The memory module of claim 17, wherein the data manager is configured as a bi-directional data transfer fabric having two or more sets of data ports coupled to any one or more of the memory controller of the host system, the volatile memory subsystem, and the non-volatile memory subsystem.

24. The memory module of claim 23, wherein at least one set of data ports is operated by the data manager to independently or concurrently transfer data to or from one or more memory segments of the volatile or non-volatile memory subsystems.

* * * * *